United States Patent
Tan

(10) Patent No.: US 8,042,032 B2
(45) Date of Patent: Oct. 18, 2011

(54) FOUR-STAGE PIPELINE BASED VDSL2 VITERBI DECODER

(75) Inventor: Yaolong Tan, Jiangsu Province (CN)

(73) Assignee: Triductor Technology (Suzhou) Inc., Jiangsu Province (CN)

( * ) Notice: Subject to any disclaimer, the term of this patent is extended or adjusted under 35 U.S.C. 154(b) by 658 days.

(21) Appl. No.: 12/086,850

(22) PCT Filed: Dec. 21, 2006

(86) PCT No.: PCT/CN2006/003513
§ 371 (c)(1),
(2), (4) Date: Oct. 29, 2008

(87) PCT Pub. No.: WO2007/071192
PCT Pub. Date: Jun. 28, 2007

(65) Prior Publication Data
US 2009/0100318 A1    Apr. 16, 2009

Related U.S. Application Data

(60) Provisional application No. 60/753,835, filed on Dec. 22, 2005.

(51) Int. Cl.
*G06F 11/00* (2006.01)
(52) U.S. Cl. .................................................. 714/795
(58) Field of Classification Search .................. None
See application file for complete search history.

(56) References Cited

U.S. PATENT DOCUMENTS

| | | | |
|---|---|---|---|
| 4,614,933 A | | 9/1986 | Yamashita et al. |
| 5,341,387 A | * | 8/1994 | Nguyen ........................ 714/788 |
| 6,848,074 B2 | * | 1/2005 | Coombs ........................ 714/795 |
| 7,656,959 B2 | * | 2/2010 | Haratsch ....................... 375/262 |
| 7,698,624 B2 | * | 4/2010 | Dimou .......................... 714/792 |
| 2002/0073378 A1 | * | 6/2002 | Shieh ............................ 714/795 |
| 2003/0028844 A1 | * | 2/2003 | Coombs ........................ 714/796 |
| 2003/0120996 A1 | * | 6/2003 | D'Arcy et al. ............... 714/795 |
| 2005/0089121 A1 | * | 4/2005 | Tsai et al. ..................... 375/341 |
| 2009/0077451 A1 | * | 3/2009 | Ferguson ...................... 714/795 |
| 2011/0161787 A1 | * | 6/2011 | Hekstra et al. ............... 714/795 |

FOREIGN PATENT DOCUMENTS

| | | |
|---|---|---|
| CN | 1395370 | 2/2003 |
| EP | 0 425 153 A2 | 5/1991 |

* cited by examiner

*Primary Examiner* — Christopher McCarthy
(74) *Attorney, Agent, or Firm* — Muirhead and Saturnelli, LLC

(57) ABSTRACT

A novel method to divide the whole decoding process of the Viterbi decoder into four pipeline stages and the Viterbi decoder therefore. With an appropriate choice on the system clock, the invention trade-off the decoding speed with the hardware cost so that the designed Viterbi decoder is able to satisfy the decoding speed requirement for the highest speed profile in VDSL2 systems, 30 MHz profile. At the same time, with four-stage pipeline to just enough to meet the speed requirement, the hardware cost for the new designed Viterbi decoder is reduced compared with single-staged decoding.

10 Claims, 4 Drawing Sheets

Branch Metrics Computation and Update

Max State Cost Computation Diagram

Information Sequence Update and Decision

FOUR-STAGE PIPELINE BASED VDSL2 VITERBI DECODER

CROSS-REFERENCE TO RELATED APPLICATION

The present application claims the benefit of provisional application No. 60/753,835 filed Dec. 22, 2005, the content of which is hereby incorporated by reference in its entirety.

FIELD OF THE INVENTION

The present invention relates to a Viterbi decoder, and more particularly to a novel four-stage pipeline based VDSL2 Viterbi decoder for hardware cost reduction.

BACKGROUND OF THE INVENTION

The Viterbi algorithm is widely used in different signal processing systems, such as those pertaining to communication or storage, to decode data transmitted over noisy channels and to correct bit errors.

In VDSL2 systems, Trellis-Code Modulation (TCM) becomes a mandatory function that has to be supported by the transmitter and receiver. Trellis-code is basically a systematic convolutional encoder. On the transmitter side, for every two sub-carriers, one bit is extracted from the Wei's 16-state 4-dimensional encoder and integrated into the raw bits to form the coded bits and corresponding constellation for each sub-carrier. On the receiver side, the Viterbi decoder is used to extract the raw bits out based on the minimum metrics cost computation for a particular survival path. Compared with the trellis encoder, the Viterbi decoder on the receiver is a much harder design and consumes much more gate counts. So, the Viterbi decoder is a very important design element in the overall VDSL2 system design.

SUMMARY OF THE INVENTION

The present invention proposes a novel method to divide the whole decoding process of the Viterbi decoder into four pipeline stages with the purpose to reduce the hardware cost. With an appropriate choice on the system clock, we trade-off the decoding speed with the hardware cost so that our designed Viterbi decoder is able to satisfy the decoding speed requirement for the highest speed profile in VDSL2 systems, 30 MHz profile. At the same time, with four-stage pipeline to just enough to meet the speed requirement, we reduce the hardware cost compared with single-staged decoding.

In accordance with the present invention, a Viterbi decoder used for VDSL2 comprises a branch metrics computation and update module for computing the cost metric for each branch and adding the branch cost with the previous node cost and finding the survival path by finding the minimum cost among all potential branches; an information sequence update and decision module for storing all the survival paths; and a decision and information retrieval module for finding one survival path with minimum cost among all the survival paths; wherein the metrics computation and update process for the metrics computation and update module being divided into four pipeline stages that correspond to the sub-groups (0, 1, 2, 3), (4, 5, 6, 7), (8, 9, A, B), and (C, D, E, F) of the VDSL2 trellis diagram; and wherein the choice on the system clock being based on the decoding speed requirement of overall VDSL2 system.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE INVENTION

Introduction to Trellis-Code Modulation in VDSL2

In VDSL2 systems, the expanded constellation partitioned into subsets or cosets. The 4-dimensional cosets in Wei's encoder can each be written as the union of two Cartesian products of two 2-dimensional cosets, as shown in the following table 1.

TABLE 1

| 4-D coset | $u_3$ | $u_2$ | $u_1$ | $u_0$ | $v_1$ | $v_0$ | $w_1$ | $w_0$ | 2-D cosets |
|---|---|---|---|---|---|---|---|---|---|
| $C_4^0$ | 0 | 0 | 0 | 0 | 0 | 0 | 0 | 0 | $C_2^0 \times C_2^0$ |
|  | 1 | 0 | 0 | 0 | 1 | 1 | 1 | 1 | $C_2^3 \times C_2^3$ |
| $C_4^4$ | 0 | 1 | 0 | 0 | 0 | 0 | 1 | 1 | $C_2^0 \times C_2^3$ |
|  | 1 | 1 | 0 | 0 | 1 | 1 | 0 | 0 | $C_2^3 \times C_2^0$ |
| $C_4^2$ | 0 | 0 | 1 | 0 | 1 | 0 | 1 | 0 | $C_2^2 \times C_2^2$ |
|  | 1 | 0 | 1 | 0 | 0 | 1 | 0 | 1 | $C_2^1 \times C_2^1$ |
| $C_4^6$ | 0 | 1 | 1 | 0 | 1 | 0 | 0 | 1 | $C_2^2 \times C_2^1$ |
|  | 1 | 1 | 1 | 0 | 0 | 1 | 1 | 0 | $C_2^1 \times C_2^2$ |
| $C_4^1$ | 0 | 0 | 0 | 1 | 0 | 0 | 1 | 0 | $C_2^0 \times C_2^2$ |
|  | 1 | 0 | 0 | 1 | 1 | 1 | 0 | 1 | $C_2^3 \times C_2^1$ |
| $C_4^5$ | 0 | 1 | 0 | 1 | 0 | 0 | 0 | 1 | $C_2^0 \times C_2^1$ |
|  | 1 | 1 | 0 | 1 | 1 | 1 | 1 | 0 | $C_2^3 \times C_2^2$ |
| $C_4^3$ | 0 | 0 | 1 | 1 | 1 | 0 | 0 | 0 | $C_2^2 \times C_2^0$ |
|  | 1 | 0 | 1 | 1 | 0 | 1 | 1 | 1 | $C_2^1 \times C_2^3$ |
| $C_4^7$ | 0 | 1 | 1 | 1 | 1 | 0 | 1 | 1 | $C_2^2 \times C_2^3$ |
|  | 1 | 1 | 1 | 1 | 0 | 1 | 0 | 0 | $C_2^1 \times C_2^0$ |

The LSBs ($v_1$, $v_0$) and ($w_1$, $w_0$) of a constellation point comprise the index i of the 2-dimensional coset $C_2^i$ in which the constellation point lies and are in fact the binary representations of this index. The three bits ($u_2$, $u_1$, $u_0$) are used to select one of the eight possible 4-dimensional cosets. The eight cosets are labeled $C_4^i$ where i is the integer with binary representation ($u_2$, $u_1$, $u_0$). The additional bit $u_3$ determines which one of the two Cartesian products of 2-dimensional cosets is chosen from the 4-dimensional coset.

Figure 1:
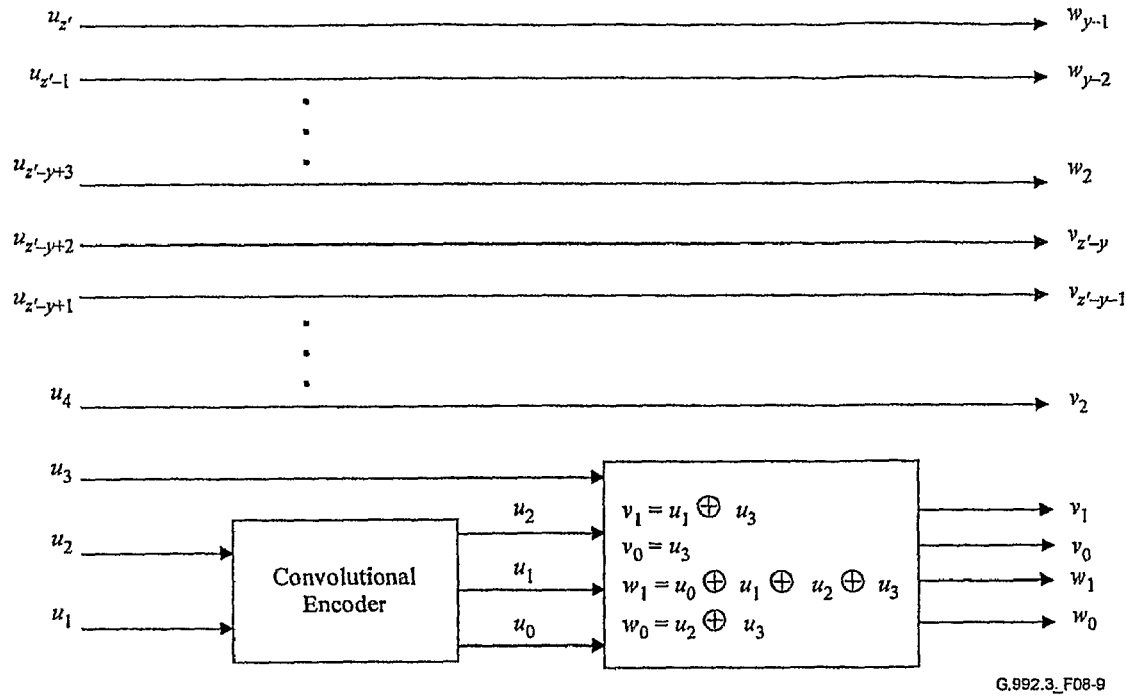
FIG. 1 shows VDSL2 Trellis Code Modulation.

The bits ($v_1$, $v_0$) and ($w_1$, $w_0$) are computed from ($u_3$, $u_2$, $u_1$, $u_0$) using the linear equations as shown in FIG. 1.

Figure 2:
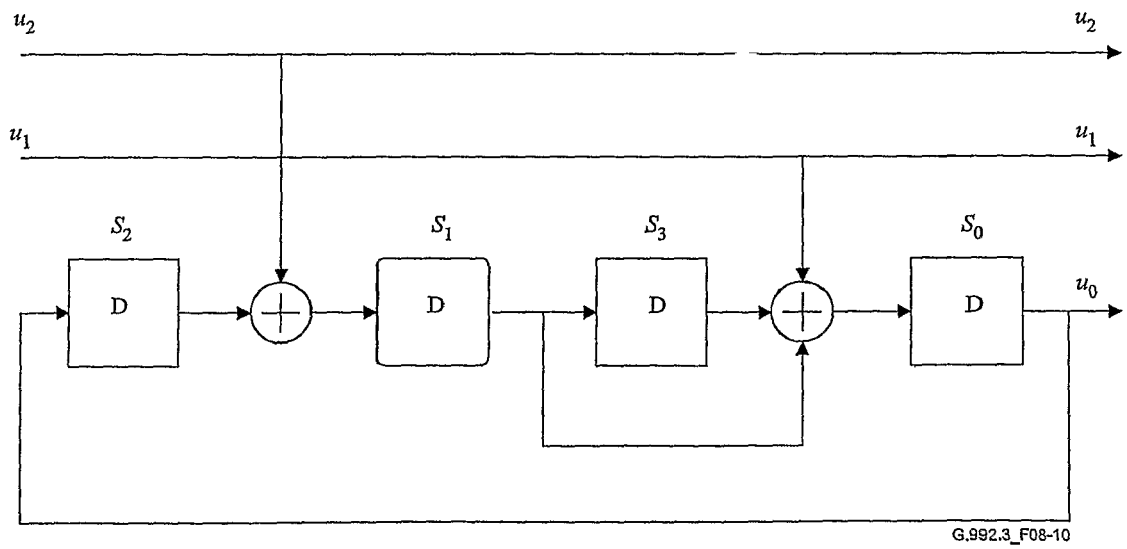
FIG. 2 shows Wei's 16-state convolutional encoder.

The convolutional encoder is Wei's 16-state convolutional encoder as shown in FIG. 2.

Figure 3:
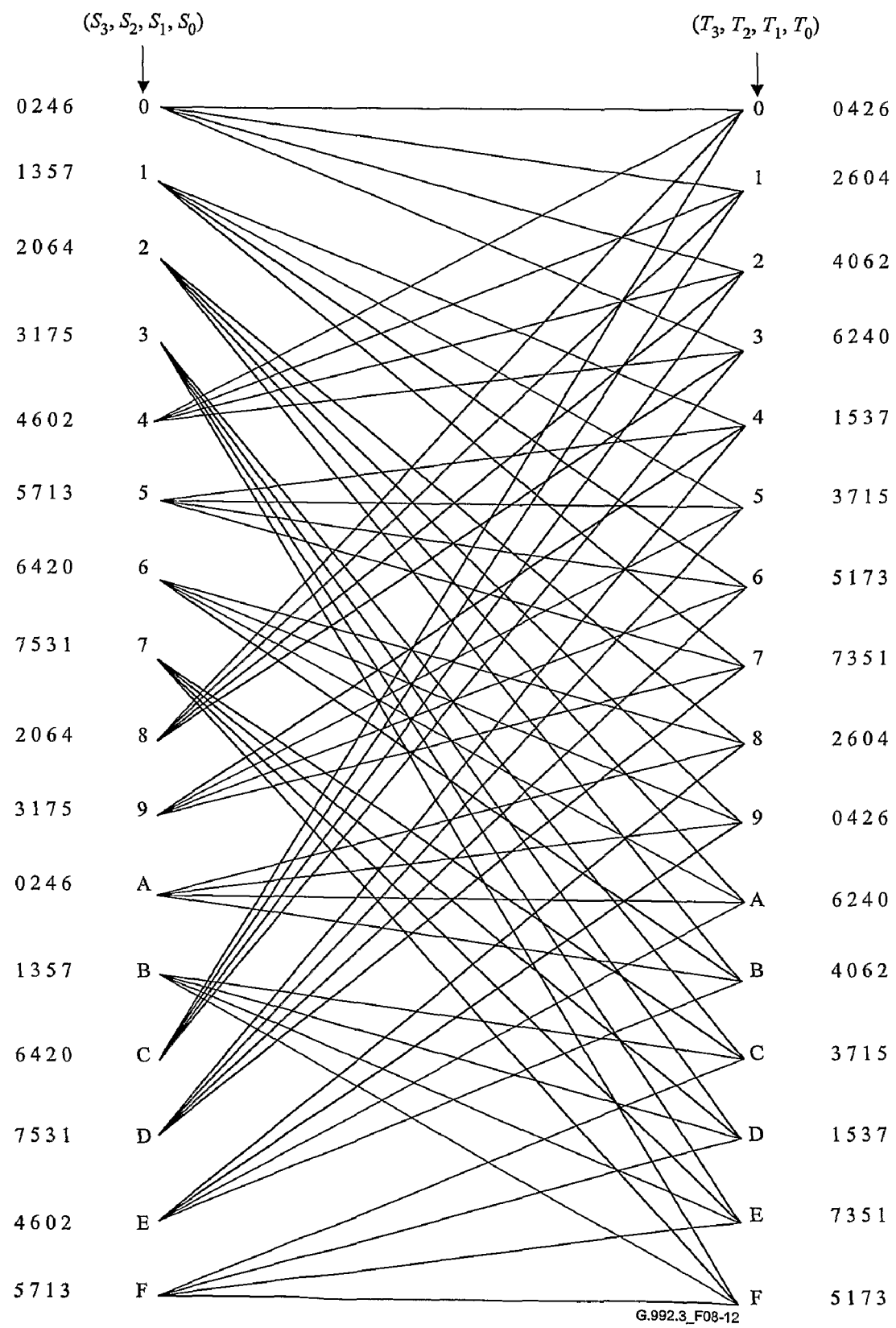
FIG. 3 shows VDSL2 Trellis Diagram.

FIG. 3 shows the trellis diagram, where ($S_3$, $S_2$, $S_1$, $S_0$) is the current state in Wei's encoder and ($T_3$, $T_2$, $T_1$, $T_0$) is the next state. The left column to the current state ($S_3$, $S_2$, $S_1$, $S_0$) shows the inputs ($u_2$, $u_1$, $u_0$) for each branch from top to bottom based on the current state ($S_3$, $S_2$, $S_1$, $S_0$). The right column to the next state ($T_3$, $T_2$, $T_1$, $T_0$) also shows the input ($u_2$, $u_1$, $u_0$) for each branch from top to bottom based on the next state ($T_3$, $T_2$, $T_{1x}$, $T_0$). If we also consider the input $u_3$, each branch actually represents two possible branches with $u_3=0$ or $u_3=1$. However, based on the minimum distance to the output set $(v_1, v_0, w_1, w_0)$, $u_3$ can be immediately decoded.

Complexity Analysis of a General Viterbi Decoder

A standard Viterbi decoding process generally includes three sequential segments: branch metric computation and update, information sequence updating, and decision and information retrieval. Branch metric computation and update uses most gate count since it computes the cost metric for each branch and add the branch cost with the previous node cost. In addition, it needs to find the survival path by finding the minimum cost among all potential branches. Information sequence updating process will update the information arrays for each survival path on each end node based on the survival path index from the branch metric computation and update process. Information sequence updating process requires significant amount of memory in order to store all the survival paths. The exact amount depends on the number of nodes and also the trellis decoding depth L. The trellis decoding depth defines how many branches of the survival path we want to trace back. The larger the length L, more memory is required. Then the length of the survival paths has exceeded the trellis tracking depth L, the decision and information retrieval find one survival path with minimum cost among all the survival paths. Then the corresponding information bits for the L-step-back branch is retrieved and sent to the next processing module together with un-coded bits on that branch.

Now we analyze the complexity of a regular Viterbi decoder. Branch metric computation and update module requires the most die area since it primarily consists of adders and comparators. As shown in the above trellis diagram, each node has four incoming branches. Each branch actually stands for two possibilities for $u_3=0$ or $u_3=1$. The first step in computing the metric for each branch is to compare the received vector $(v_1, v_0, w_1, w_0)$ with the desired vector $(v_1, v_0, w_1, w_0)$ for each possible paths in each branch, which means 2 four-bit comparators. Then two branch costs are compared and the minimum cost and its corresponding $u_3$ value is recorded. This means we need 2 bit-ones counters and one 2-bit comparators for each branch. The next step is to add the current branch cost to the cost of the previous node to obtain the aggregated cost for each incoming branch. If we use 12 bits for the aggregated cost, we need 4 12-bit adders for all four incoming branches. Then the aggregated costs for all four incoming branches are compared to find the survival paths for the node, which takes three 12-bit comparators. The process is then repeated for all 16 nodes. Now we can count the resources we need for the branch metric computation and update module. It needs a total of 128 four-bit comparators, 128 bit-ones counters, 64 2-bit comparators, 64 12-bit adders, and 48 12-bit comparators. We can see significant amount of resources are needed to carry out the metric computation and update.

Information sequence update module does not require much logics, instead it requires memory to buffer one information-bit sequence for each node. For a decoding depth of L and maximum 15 un-coded bits for each sub-carrier, it needs a total of 29×16×L-bit registers (29 bits for each branch comes with 26 un-coded bits and 3 decoded bits). The reason that the registers are used instead of SRAM is because of the fact that it needs to simultaneously update all the information-bit sequence all at once. This is due to the fact that the same information-bit registers for the previous nodes are used also for the next node. So, the update process needs to be fulfilled at one clock cycle.

Decision and information retrieval module finds the minimum cost among all 16 survival paths of the next nodes, which requires a total of 15 12-bit comparators. The information retrieval is trivial and may consist of shift registers and register multiplexing.

From the above analysis, we can see that most of computation resource is used by the branch metric computation and update module and the decision and information retrieval module. Therefore, we propose a novel pipeline-based Viterbi decoding implementation to reduce the computational resource usage by almost three-fourth. The detail is given in the next section.

Four-Stage Pipeline Based Viterbi Decoder with Reduced Complexity

The analysis in the previous section gives us some basic idea of the computational complexity. The total number of computations we need for the Viterbi decoding process is fixed in term of total comparison operations, additions, etc. However, with carefully chosen faster system clock, we would be able to time-share some of the comparators and adders to reduce the requirement on the number of actual comparators and adders we need. The choice on the system clock is based on the decoding speed requirement in terms of overall VDSL2 systems. Also it is based on the structural pattern that we can find on the given trellis diagram.

First, let us take a look at the speed requirement. The most restrict speed requirement comes for 30 MHz profile who has a sub-carrier frequency of 8.625 KHz, a frame rate of 8 kHz, and a total of 4096 sub-carriers. Since the Viterbi decoding is based on a pair of sub-carriers, the maximum number of iteration for the aforementioned Viterbi decoding process is 2048. Actual requirement could be smaller because of the sub-carriers are split into upstream and downstream. So for each direction, the number of trellis pairs shall be less than 2048. However, to be conservative and flexibility, we still use 2048 in our consideration. We assume that the information sequence update and the decision and information retrieval each take one clock cycles. Now the key question is how we can split the branch metric computation and update process to minimize the hardware requirement while still meet the speed requirement. If we assume we finish the metric computation and update in one system clock cycle, then the minimum system clock to meet the speed requirement can be computed as 2048×3×8 KHz or 49.152 MHz. Now we look at the trellis diagram, we can see that each previous node only goes to four next nodes and each next node is also only connected to four previous nodes. Furthermore, we can see that the branches connected to the next nodes 0, 1, 2 and 3 all come from the same previous nodes: 0, 4, 8, C. The branches connected to the next nodes 4, 5, 6 and 7 all come from the same previous nodes: 1, 5, 9, D. the branches connected to the next nodes 8, 9, A and B all come from the same previous nodes: 2, 6, A, E. The branches connected to the next nodes C, D, E and F all come from the same previous nodes: 3, 7, B, F. This means that we can completely split the trellis diagram into four independent sub-groups and explore the time sharing mechanism with out overhead on the complex multiplexing scheme. So, if we split the metric computation and update process into four pipeline stages with sub-groups (0, 1, 2, 3), (4, 5, 6, 7), (8, 9, A, B), (C, D, E, F), the minimum system clock to support the VDSL2 30 MHz profile is 2048×6×8 KHz or 98.304 MHz. So, we choose 141.312 MHz as our system clock, which is basically 2 times of the 70.656 MHz sampling clock frequency required by the VDSL2 30 MHz profile. This is enough to meet 98.304 MHz minimum system clock requirement with our four-stage pipeline scheme.

Figure 4:
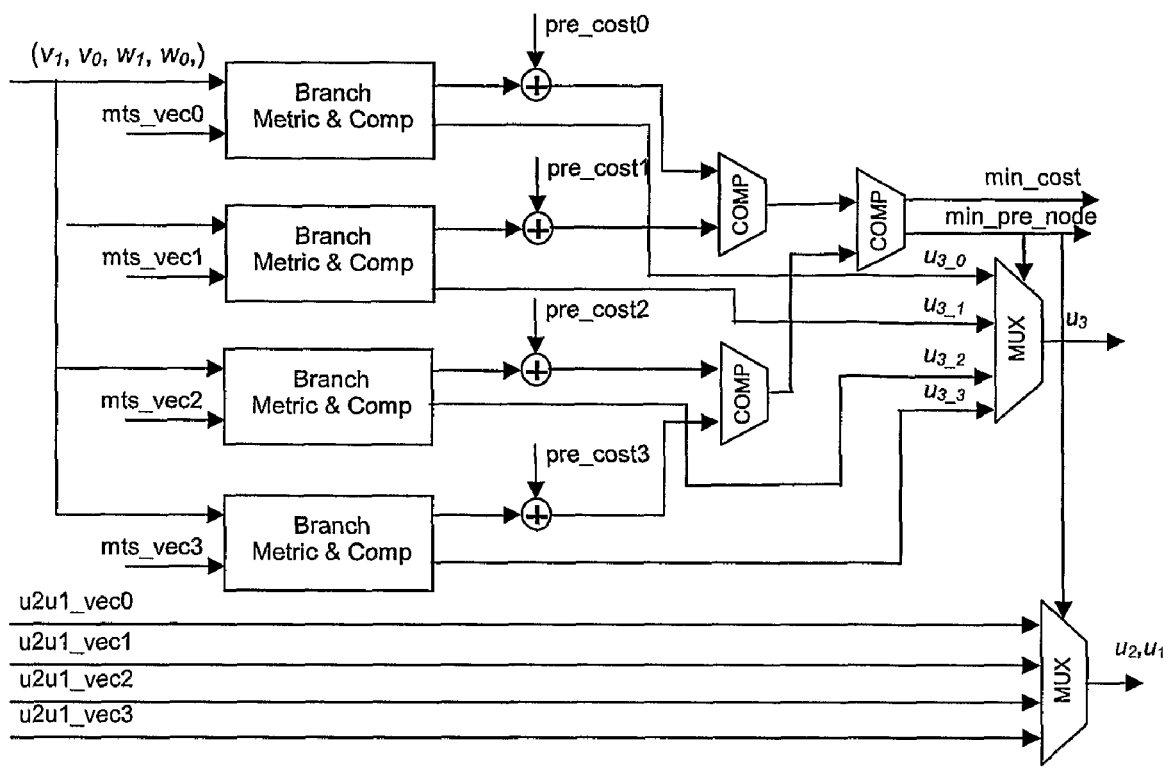
FIG. 4 shows branch metrics cost computation and adaptation diagram.
Figure 5:
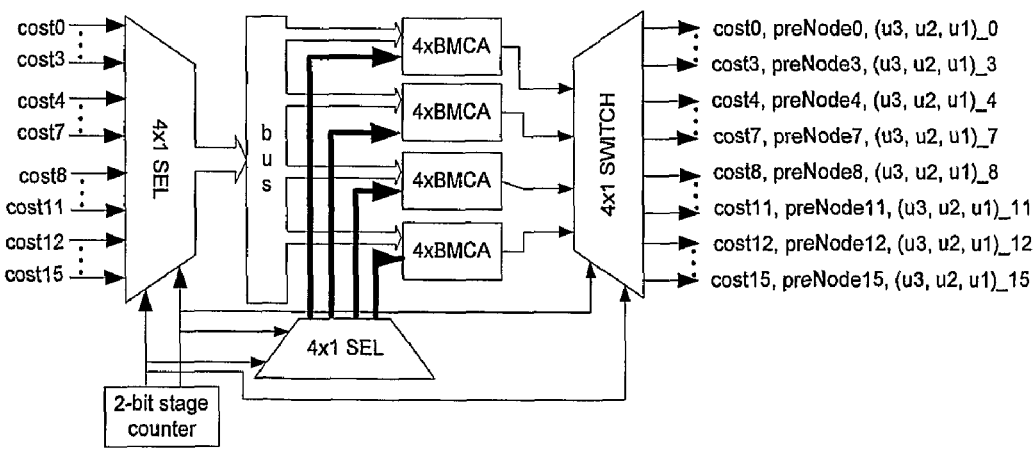
FIG. 5 shows branch metric computation and update diagram.

The basic building block Branch Metrics Computation and Adaptation (BMCA) is shown in FIG. 4. The mts_vec0, mts_vmts_vec2, mts_vec3 are the desired output for each branch, which basically are determined by the given trellis tree structure shown in FIGS. 1, 2 and 3 and are static configuration values in the implementation. The distances between mts_vec0, mts_vec1, mts_vec2, mts_vec3 and ($v_1$, $v_0$, $w_1$, $w_0$) are the Euclidean distance for each branch in the Trellis diagram in FIG. 3. Branch Metric and Comparator determines $u_3$ by finding minimum possibility for each branch and therefore one of two branches in Table 1 will be chosen for each four dimensional coset. The branch metric is added together with the cost of the previous node. Three comparators find the minimum cost of all four branches and its corresponding survival path by identifying the previous node associated with the minimum cost. In addition, the previous node id is used to select which one of ($u_2$, $u_1$, $u_0$) shall be the final winner and the corresponding values, minimum cost for four branches, and the corresponding id for the previous node is passed to the calling modules As we discussed before, in the branch metric computation and updating process, the branch metrics computation for all 16 next nodes are split into four-stage pipeline. FIG. 5 shows the hardware diagram for the branch metric computation and update process, which basically instantiate four BMCA sub-modules to take care of minimum cost decision within each group. In FIG. 5, we use 4xBMCA as our label to emphasize the fact it simultaneously computes the metric cost for all four branches to a single next node. Two-bit counter is used to generate reference signal for each stage. All 16 nodes shown in FIG. 3 are split into four different groups and the associated costs are also split into four groups, namely group 1: cost0, cost1, cost2, cost3, group 2: cost4, cost5, cost6, cost7, group 3: cost8, cost9, cost10, cost11, and group 4: cost12, cost13, cost14, cost15. Reference signal generated by two-bit counter will decide which group is accepted into the branch metrics cost computation and adaptation module as shown in FIG. 4. At the end of four stage process, the winning node with minimum cost for each group is clocked out with the information related to the computed cost for the winning node in each group, the label for the previous node that constructs the winning branch, and associated decoded candidate vector ($u_2$, $u_1$, $u_0$). The value of cost function cost0 is associated with the starting point of the trellis diagram so that it shall be initialized to zero.

The branch metrics for four next nodes are computed at every clock cycle. For the clock cycle 0, the survival paths and corresponding costs, and the decoded ($u_3$, $u_2$, $u_1$) bits for the next nodes (0, 1, 2, 3) are computed while the previous nodes (0, 4, 8, C) are chosen as inputs. For the clock cycle 1, the same parameters for the next nodes (4, 5, 6, 7) are computed while the previous nodes (1, 5, 9, D) are chosen as inputs. For the clock cycle 2, the same parameters for the next nodes (8, 9, A, B) are computed while the previous nodes (2, 6, A, E) are the inputs. For the last clock cycle, the same parameters for the next nodes (C, D, E, F) are computed while the previous nodes (3, 7, B, F) are used as the inputs. Since the maximum Euclidean distance for each branch is 2 and the total length of TCM shall be less than 2048, we need 12-bit cost for each stage, which requires 16 12-bit registers for all states. Since the branch metrics are updated in four 4-state groups, we need two sets of cost tables for old and newly-computed cost for each state. So, a total 32 12-bit registers are needed for the cost storage.

Figure 6:
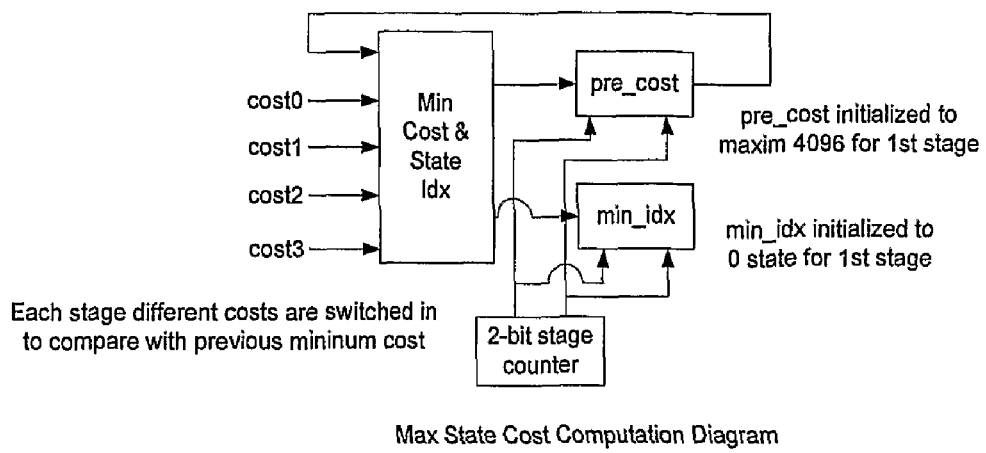
FIG. 6 shows minimum state cost computation.

In the decision and information retrieval process, we need to find the minimum cost across all 16 states to determine the survival path for L-step earlier. This can also be split into four stages to reduce the hardware complexity by almost three fourth as well instead of comparing them at the same time. An illustrative diagram is shown as in FIG. 6. Similarly two-bit counter generates reference signal for four stages. pre-cost is initialized to a large number such as 4096, which basically will be replaced at the first stage while comparing with the first cost value. At the end of each stage, the minimum cost will be clocked into the pre-cost register while the corresponding node is clocked into the min_idx register as well. After four stage, the minimum cost and corresponding node index is shifted out to be used in the information sequence update and decision module as shown in FIG. 7.

After four cycles, the pre_cost shall contain the minimum cost while min_idx shall contain the node id corresponding to the minimum cost. The min_idx is then used to retrieve the information bits ($u_3$, $u_2$, $u_1$) of L step earlier. If the Viterbi decoder reaches the last TCM pairs, then min_idx shall be forced to 0 and only the branches to the state 0 shall be considered as the survival path candidates since the TCM on the transmitter will ensure that the Wei's encoder state back to zero by forcing ($u_2$, $u_1$) for last two trellis pairs. It is clear that the decoded ($u_2$, $u_1$) for the last two pairs shall be discarded and not be sent to PMS.

Figure 7:
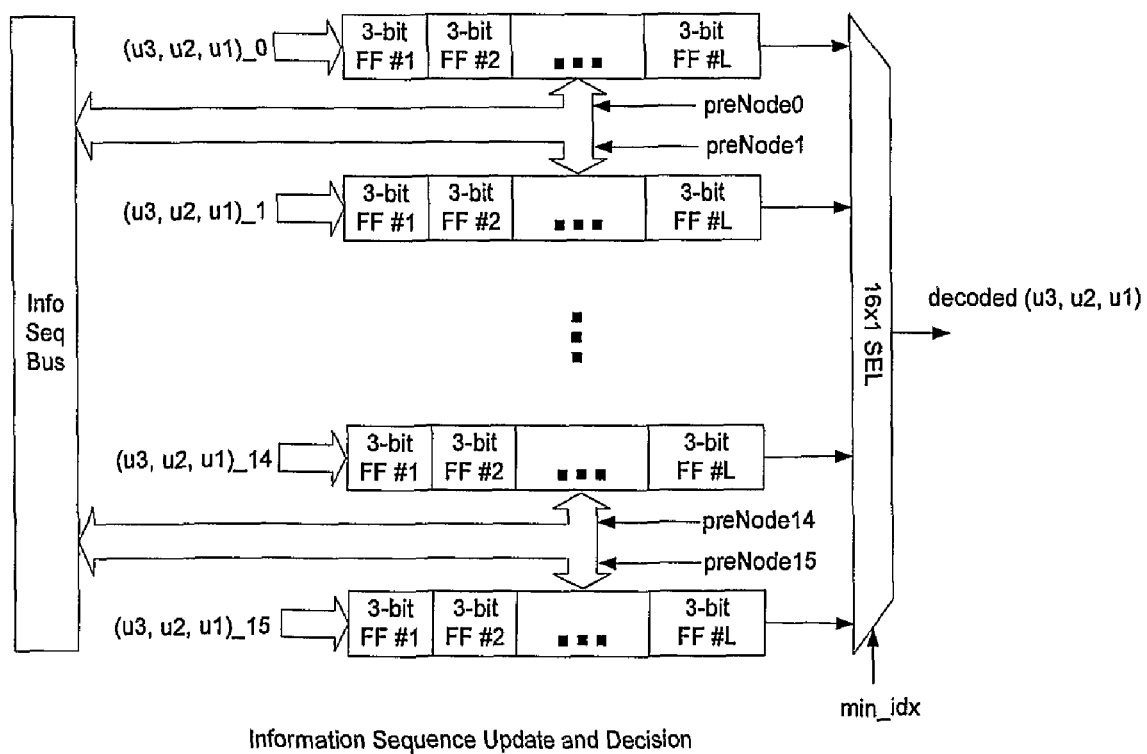
FIG. 7 shows information sequence update and decision.

The last procedure in our Viterbi decoder is to update the survival information sequence for all the states and clock out the decoded information bits of L step earlier as shown in FIG. 7. The decoded candidate vector ($u_3$, $u_2$, $u_1$) for each node in the trellis diagram shown in FIG. 3 is shifted a FIFO that basically buffers the survival path for each node. At the same time, the decoded information bits ($u_3$, $u_2$, $u_1$) that corresponds to the branch that is L step earlier are clocked out based on the minimum branch index determined in FIG. 6 of minimum state cost computation module.

In the middle of the Viterbi decoding, only the last 3-bit register shall be clocked out as the decoded information bits. However, if the Viterbi decoder has reached the final pair, then all the information registers for the state 0 shall be clocked out except ($u_2$, $u_1$) for the last two pairs. In FIG. 7, the un-coded bits are not shown at all. Similarly the un-coded bits for each trellis pairs shall be buffered and clocked in the same way as ($u_3$, $u_2$, $u_1$).

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A Viterbi decoder used for VDSL2, comprising:
   a branch metrics computation and update module for computing the cost metric for each branch, adding the branch cost with the previous node cost, and finding the survival path by finding the minimum cost among all potential branches;
   an information sequence update and decision module for storing all the survival paths; and
   a decision and information retrieval module for finding one survival path with minimum cost among all the survival paths;
   wherein the metrics computation and update process for the metrics computation and update module being divided into four pipeline stages that correspond to the sub-groups (0, 1, 2, 3), (4, 5, 6, 7), (8, 9, A, B), and (C, D, E, F) of the VDSL2 trellis diagram; and wherein the choice of the system clock being based on the decoding speed requirement of overall VDSL2 system.

2. The Viterbi decoder of claim 1, wherein the choice of the system clock also being based on the structural pattern of the trellis diagram.

3. The Viterbi decoder of claim 1, wherein the branch metrics computation for all 16 next nodes are split into four-stage pipeline.

4. The Viterbi decoder of claim 3, wherein the branch metrics computation and update module comprising:

four BMCA sub-modules to take care of minimum cost decision within each group, wherein each BMCA sub-module simultaneously computes the metric cost for all four branches to a single next node; and a two-bit counter to generate reference signal for each stage, wherein the reference signal decides which sub-group is accepted into the BMCA sub-module;

wherein, at the end of four stage process, the winning node with minimum cost for each group is clocked out with the information related to the computed cost for the winning node in each group, the label for the previous node that constructs the winning branch, and associated decoded candidate vector (u2, u1, u0).

5. The Viterbi decoder of claim 4, wherein the BMCA sub-module comprising:

four branch metric and comparators for determining the input (u3) by finding minimumpossibility for each branch and therefore one of two branches in the Four Dimensional Cosets table will be chosen for each four dimensional coset;

adders for adding the branch metric together with the cost of the previous node; and three comparators for finding the minimum cost of all four branches and its corresponding survival path by identifying the previous node associated with the minimum cost;

wherein, the distances between the desired output (mts_vec0, mts_vec1, mts_vec2, mts_vec3) for each branch and the output set (v1, v0, w1, w0) are the Euclidean distance for each branch in the VDSL2 Trellis diagram; and the previous node id is used to select which one of the input (u2, u1, u0) for each branch shall be the final winner and the corresponding values, minimum cost for four branches, and the corresponding id for the previous node is passed to the calling modules.

6. The Viterbi decoder of claim 4, wherein the branch metric computation and update module is configured so that the branch metrics for four next nodes are computed at every clock cycle: for the clock cycle 0, the survival paths and corresponding costs, and the decoded (u3, u2, u1) bits for the next nodes (0; 1, 2, 3) are computed while the previous nodes (0, 4, 8, C) are chosen as inputs; for the clock cycle 1, the same parameters for the next nodes (4, 5, 6, 7) are computed while the previous nodes (1, 5, 9, D) are chosen as inputs; for the clock cycle 2, the same parameters for the next nodes (8, 9, A, B) are computed while the previous nodes (2, 6, A, E) are the inputs; for the last clock cycle, the same parameters for the next nodes (C, D, E, F) are computed while the previous nodes (3, 7, B, F) are used as the inputs.

7. The Viterbi decoder of claim 1, wherein the system clock is faster than the minimum system clock to support the VDSL2.

8. The Viterbi decoder of claim 7, wherein the system clock is 141.312 MHz.

9. The Viterbi decoder of claim 1, wherein the decision and information retrieval module is configured so that the process to find the minimum cost to determine the survival path that is for the decision and information retrieval module also being split into four stages.

10. The Viterbi decoder of claim 9, wherein the decision and information retrieval process being:

a two-bit counter generates reference signal for four stages;

pre-cost is initialized to a large number, which basically will be replaced at the first stage while comparing with the first cost value;

at the end of each stage, the minimum cost will be clocked into the pre-cost register while the corresponding node is clocked into the min_idx register as well;

after four stage, the minimum cost and corresponding node index is shifted out to be used in the information sequence update and decision module.

* * * * *